United States Patent
Endo et al.

(10) Patent No.: US 11,011,398 B2
(45) Date of Patent: May 18, 2021

(54) FUME DETERMINATION METHOD, SUBSTRATE PROCESSING METHOD, AND SUBSTRATE PROCESSING EQUIPMENT

(71) Applicant: SCREEN Holdings Co., Ltd., Kyoto (JP)

(72) Inventors: Toru Endo, Kyoto (JP); Masayuki Hayashi, Kyoto (JP); Nobuyuki Shibayama, Kyoto (JP); Hideji Naohara, Kyoto (JP); Hiroaki Kakuma, Kyoto (JP); Yuji Okita, Kyoto (JP); Tatsuya Masui, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 140 days.

(21) Appl. No.: 16/203,642

(22) Filed: Nov. 29, 2018

(65) Prior Publication Data

US 2019/0172737 A1 Jun. 6, 2019

(30) Foreign Application Priority Data

Dec. 5, 2017 (JP) .............................. JP2017-233471
May 29, 2018 (JP) .............................. JP2018-102167

(51) Int. Cl.
  *G06K 9/00* (2006.01)
  *H01L 21/67* (2006.01)
  (Continued)

(52) U.S. Cl.
  CPC ..... *H01L 21/67253* (2013.01); *G01N 21/892* (2013.01); *G01N 21/94* (2013.01); *G06T 7/001* (2013.01); *H01L 21/67051* (2013.01); *H01L 21/67288* (2013.01); *H01L 21/681* (2013.01); *H01L 21/68742* (2013.01); *H01L 21/68764* (2013.01); *G01N 2021/8928* (2013.01); *G06T 2207/30148* (2013.01); *G06T 2207/30164* (2013.01)

(58) Field of Classification Search
  None
  See application file for complete search history.

(56) References Cited

U.S. PATENT DOCUMENTS

| | | | | |
|---|---|---|---|---|
| 4,852,133 A | * | 7/1989 | Ikeda | ................... G03F 7/70866 378/34 |
| 6,198,792 B1 | * | 3/2001 | Kanouff | .............. G03F 7/70233 378/34 |

(Continued)

FOREIGN PATENT DOCUMENTS

| JP | S61240645 | 10/1986 |
|---|---|---|
| JP | 2008102027 | 5/2008 |

(Continued)

*Primary Examiner* — Shervin K Nakhjavan
(74) *Attorney, Agent, or Firm* — JCIPRNET

(57) ABSTRACT

In equipment that supplies a processing liquid on a top surface of a substrate while holding the substrate horizontally in a chamber a generation status of fumes is determined. Specifically, an image of a predetermined imaging area in the chamber is captured. Then, the generation status of fumes in the chamber is determined based on luminance values of the captured image acquired by the capturing of an image. Accordingly, it is possible to quantitatively determine whether a generation status of fumes in a chamber is normal.

14 Claims, 15 Drawing Sheets

(51) Int. Cl.
  *G01N 21/892* (2006.01)
  *G01N 21/94* (2006.01)
  *G06T 7/00* (2017.01)
  *H01L 21/687* (2006.01)
  *H01L 21/68* (2006.01)

(56) References Cited

U.S. PATENT DOCUMENTS

| | | | |
|---|---|---|---|
| 6,867,923 B2* | 3/2005 | Singer | G02B 3/14 |
| | | | 355/52 |
| 7,006,682 B1 | 2/2006 | Moriya et al. | |
| 8,187,522 B2 | 5/2012 | Higashi et al. | |
| 10,312,120 B2* | 6/2019 | Ravid | C23C 16/4584 |
| 10,586,695 B2 | 3/2020 | Ota et al. | |
| 2005/0030537 A1* | 2/2005 | Hayashi | G03F 7/70841 |
| | | | 356/401 |
| 2006/0091310 A1* | 5/2006 | Furry | G01N 21/3518 |
| | | | 250/330 |
| 2007/0054035 A1* | 3/2007 | Hosoi | C09K 11/7733 |
| | | | 427/69 |
| 2008/0029699 A1* | 2/2008 | Kaneoka | H01J 37/3056 |
| | | | 250/307 |
| 2008/0297797 A1 | 12/2008 | Wright | |
| 2010/0044547 A1* | 2/2010 | Higashi | B33Y 40/00 |
| | | | 249/79 |
| 2011/0146908 A1* | 6/2011 | Kobayashi | H01J 37/32981 |
| | | | 156/345.24 |
| 2013/0287627 A1* | 10/2013 | Livchak | A61L 9/20 |
| | | | 422/3 |
| 2015/0377764 A1* | 12/2015 | Pan | G01N 15/1434 |
| | | | 356/36 |
| 2016/0356999 A1* | 12/2016 | Fine | G01T 1/02 |
| 2017/0148612 A1* | 5/2017 | Suzuki | H01J 37/32935 |
| 2017/0282245 A1* | 10/2017 | Yasuda | B29C 64/371 |
| 2020/0176261 A1* | 6/2020 | Takeda | H01L 21/3065 |

FOREIGN PATENT DOCUMENTS

| | | |
|---|---|---|
| JP | 2010047813 | 3/2010 |
| JP | 2010056405 | 3/2010 |
| JP | 2016143874 | 8/2016 |

* cited by examiner

FUME DETERMINATION METHOD, SUBSTRATE PROCESSING METHOD, AND SUBSTRATE PROCESSING EQUIPMENT

CROSS REFERENCE TO RELATED APPLICATIONS

This application claims the priority benefit of Japan application serial no. 2017-233471, filed on Dec. 5, 2017, and Japan application serial no. 2018-102167, filed on May 29, 2018. The entirety of each of the above-mentioned patent applications is hereby incorporated by reference herein and made a part of this specification.

BACKGROUND

Technical Field

The disclosure relates to a technique for determining a generation status of fumes in equipment which is used for a process of manufacturing a sheet-shaped substrate such as a semiconductor wafer.

Description of Related Art

In a process of manufacturing a semiconductor wafer according to the related art, substrate processing equipment that supplies various processing liquids such as a photo resist solution, an etching solution, a cleaning solution, and pure water to a substrate and processes the surface of the substrate is used. An example of substrate processing equipment according to the related art is described in Japanese Patent Application Laid-Open No. 2010-056405. The equipment described in the publication includes a rotation mechanism that holds and rotates a substrate and a supply nozzle that supplies a processing liquid to a processed surface of the substrate which is rotated by the rotation mechanism (see claim 1 and FIG. 1).

In this type of substrate processing equipment, when a specific processing liquid is supplied to the surface of a substrate, an atmosphere including particulates (for example, solid particulates or micro-droplets such as water droplets) called fumes may be generated. For example, in the process of supplying an SPM cleaning solution which is a mixed solution of sulfuric acid and hydrogen peroxide water to the surface of a substrate, the fumes are generated. It is known that fumes are particularly easily generated when an SPM cleaning solution at a high temperature equal to or higher than 150° C. is supplied or when supply of sulfuric acid is stopped and only hydrogen peroxide water is additionally supplied after the SPM cleaning solution has been supplied.

When such fumes diffuse in a chamber of the substrate processing equipment and are attached to constituent members thereof, the attached fumes solidify into particles. The particles may be attached to the surface of a substrate and contaminate the substrate. Accordingly, it is preferable for a user to accurately ascertain a generation status of fumes in the chamber and take measures in the event of an abnormality. In the substrate processing equipment according to the related art, a user should visually determine whether the generation status of fumes in the chamber is normal.

SUMMARY

The disclosure provides a fume determination method and substrate processing equipment that can quantitatively determine whether a generation statue of fumes in a chamber is normal.

According to the disclosure, there is provided a fume determination method of determining a generation status of fumes in equipment that supplies a processing liquid on a top surface of a substrate while holding the substrate horizontally in a chamber, the fume determination method including: a) capturing an image of a predetermined imaging area in the chamber; and b) determining a generation status of fumes in the chamber based on luminance values of the captured image acquired in the step of a).

According to the disclosure, there is provided a substrate processing method in equipment that supplies a processing liquid to a top surface of a substrate while holding the substrate horizontally in a chamber, the equipment including a cup that surrounds the substrate and an exhaust unit that discharges a gas from a space inside the cup to the outside of the chamber, the substrate processing method including: a) capturing an image of a predetermined imaging area in the chamber; b) determining a generation status of fumes in the chamber based on luminance values of the captured image acquired in the step of a); and c) changing a position of the cup in a vertical direction based on the determination result in the step of b).

According to the disclosure, there is provided substrate processing equipment including: a chamber; a substrate holding unit configured to hold a substrate horizontally in the chamber; a processing liquid supply unit configured to supply a processing liquid to a top surface of a substrate held by the substrate holding unit; an imaging unit configured to capture an image of a predetermined imaging area in the chamber; and a determination unit configured to determine a generation status of fumes in the chamber based on luminance values of the captured image acquired by the imaging unit.

According to the disclosure, it is possible to quantitatively determine whether a generation statue of fumes in a chamber is normal based on luminance values of a captured image.

DESCRIPTION OF THE EMBODIMENTS

Hereinafter, an embodiment of the disclosure will be described in detail with reference to the accompanying drawings.

<1. Whole Configuration of Substrate Processing Equipment>

Figure 1:
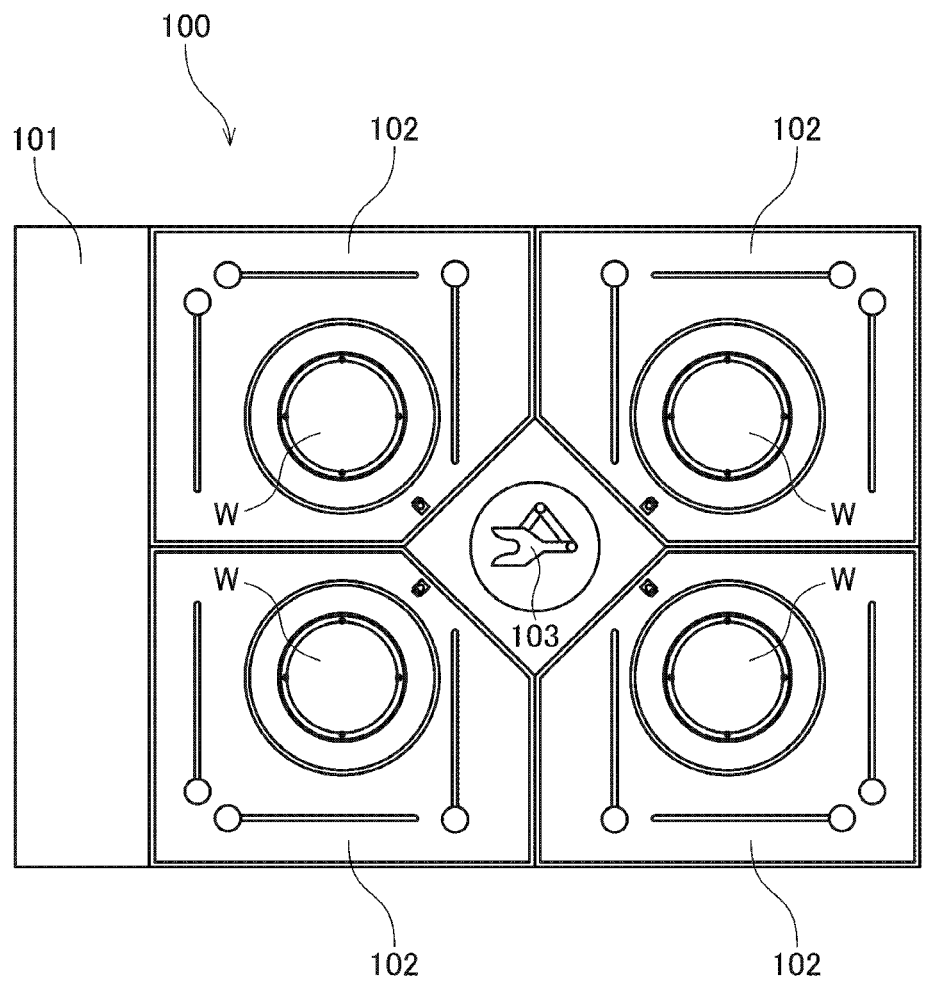
FIG. 1 is a plan view of substrate processing equipment.

FIG. 1 is a plan view of substrate processing equipment 100 according to an embodiment of the disclosure. The substrate processing equipment 100 is equipment that processes a surface of a disc-shaped substrate W (a silicon wafer) in the process of manufacturing a semiconductor wafer. The substrate processing equipment 100 performs a liquid process of supplying a processing liquid to the surface of a substrate W and a drying process of drying the surface of the substrate W.

As illustrated in FIG. 1, the substrate processing equipment 100 includes an indexer 101, a plurality of processing units 102, and a main delivery robot 103.

The indexer 101 is a part that is used to load a non-processed substrate W from the outside and to unload a processed substrate W to the outside. A plurality of carriers that accommodates a plurality of substrates W are disposed in the indexer 101. The index 101 includes a transfer robot which is not illustrated. The transfer robot transfers a substrate W between a carrier in the indexer 101 and the processing unit 102 or the main delivery robot 103. For example, a known front opening unified pod (FOUP) or a standard mechanical interface (SMIF) pod that accommodates a substrate W in a closed space or an open cassette (OC) in which an accommodated substrate W comes in contact with outside air is used as the carrier.

The processing unit 102 is a so-called single-wafer processing unit that processes a substrate W sheet by sheet. A plurality of processing units 102 are disposed around the main delivery robot 103. In this embodiment, four processing units 102 disposed around the main delivery robot 103 are stacked in three stages in the height direction. That is, the substrate processing equipment 100 according to this embodiment includes a total of 12 processing units 102. A plurality of substrates W are processed in parallel by the processing units 102. The number of processing units 102 in the substrate processing equipment 100 is not limited to 12 and may be, for example, 8, 4, or 1.

The main delivery robot 103 is a mechanism that delivers a substrate W between the indexer 101 and the plurality of processing units 102. The main delivery robot 103 includes, for example, a hand that holds a substrate W and an arm that moves the hand. The main delivery robot 103 takes out a non-processed substrate W from the indexer 101 and delivers the substrate W to one processing unit 102. When processing the substrate W in the processing unit 102 has been completed, the main delivery robot 103 takes out the processed substrate W from the processing unit 102 and delivers the substrate W to the indexer 101.

<2. Configuration of Processing Unit>

A configuration of a processing unit 102 will be described below. One of a plurality of processing units 102 in the substrate processing equipment 100 will be described below and the other processing units 102 have the same configuration.

Figure 2:
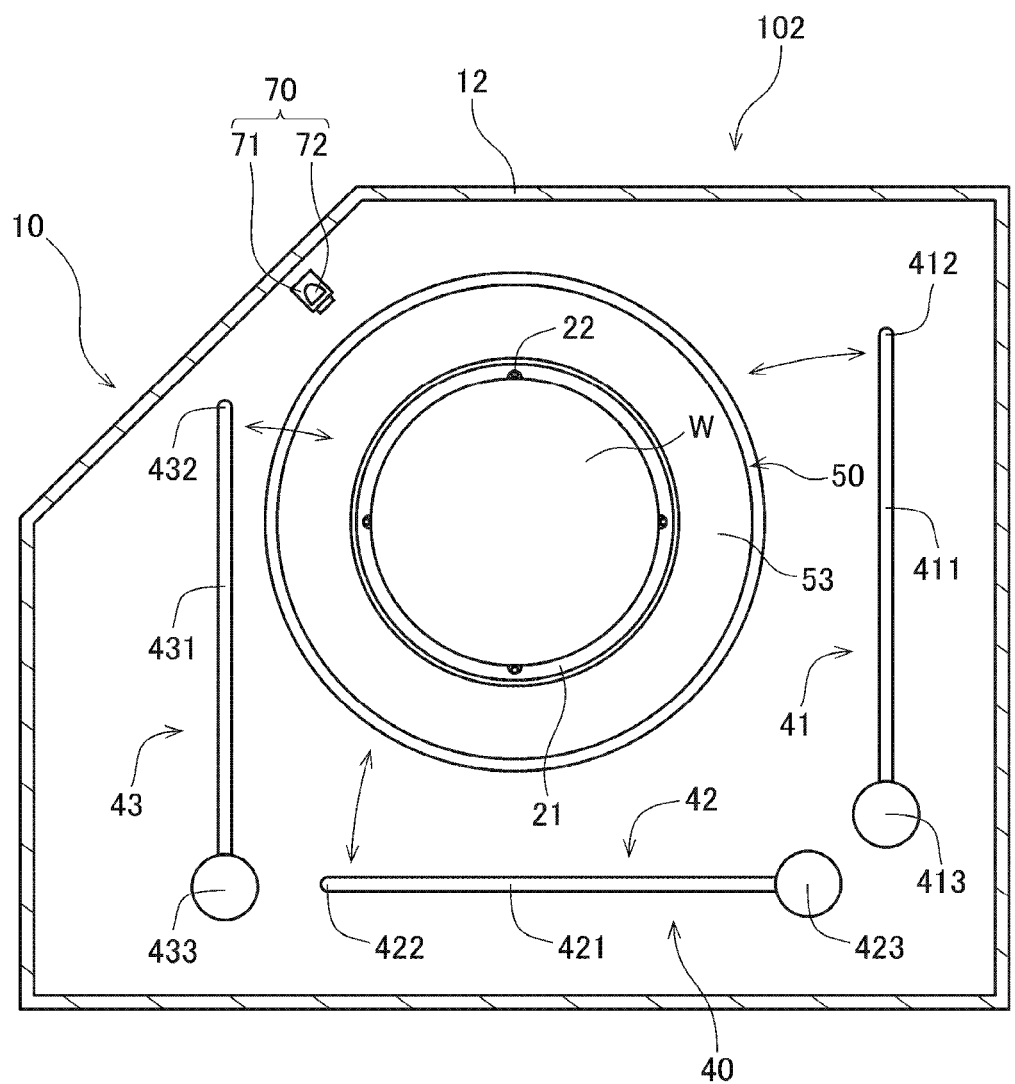
FIG. 2 is a plan view of a processing unit.
Figure 3:
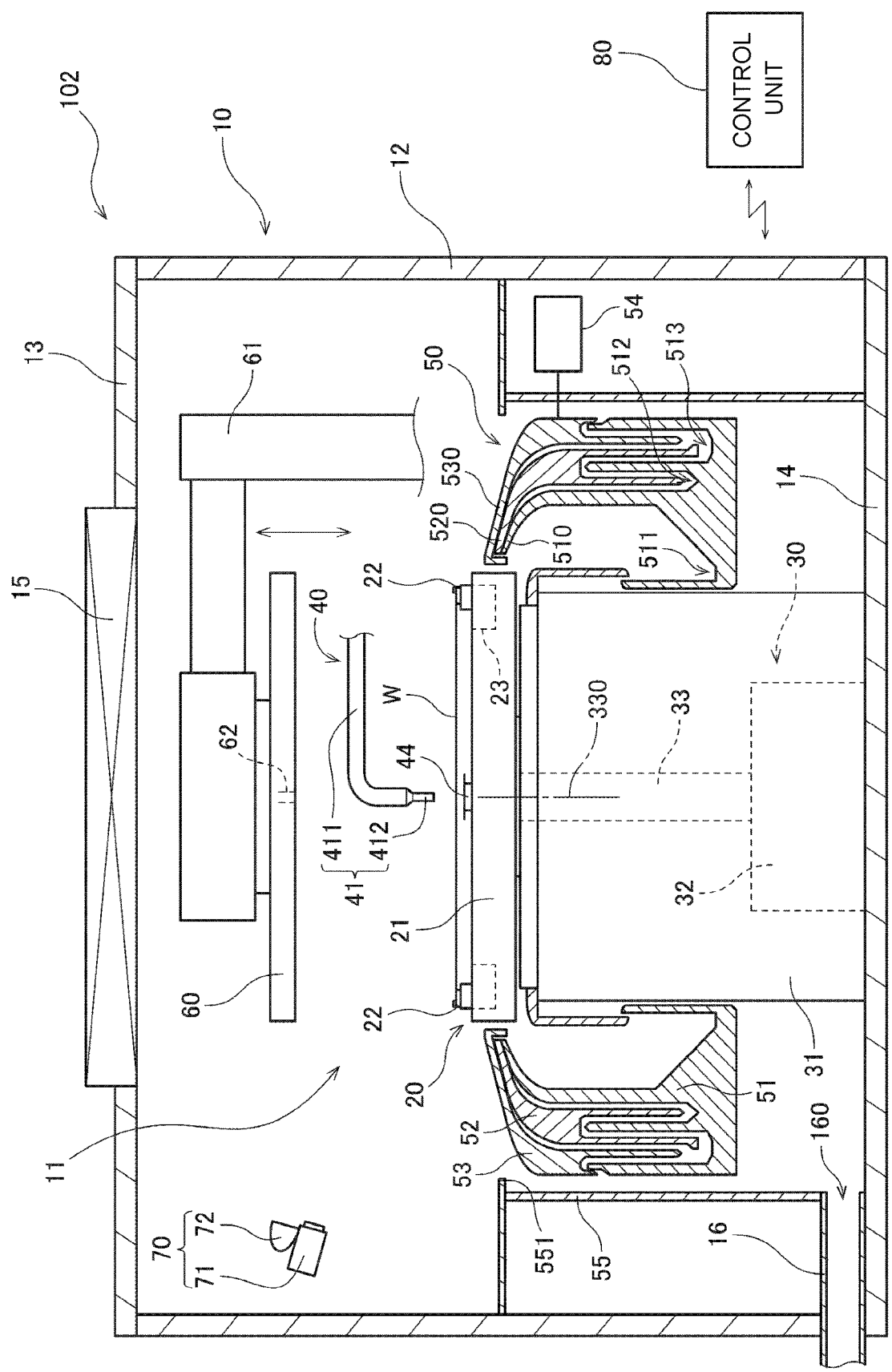
FIG. 3 is a longitudinal sectional view of the processing unit.

FIG. 2 is a plan view of a processing unit 102. FIG. 3 is a longitudinal sectional view of the processing unit 102. As illustrated in FIGS. 2 and 3, the processing unit 102 includes a chamber 10, a substrate holding unit 20, a rotation mechanism 30, a processing liquid supply unit 40, a processing liquid collecting unit 50, a blocking plate 60, an imaging unit 70, and a control unit 80.

The chamber 10 is a casing having a processing space 11 for processing a substrate W therein. The chamber 10 includes a side wall 12 that surrounds sides of the processing space 11, a top plate portion 13 that covers the top of the processing space 11, and a bottom plate portion 14 that covers the bottom of the processing space 11. The substrate holding unit 20, the rotation mechanism 30, the processing liquid supply unit 40, the processing liquid collecting unit 50, the blocking plate 60, and the imaging unit 70 are accommodated in the chamber 10. A loading/unloading port through which loading of a substrate W into the chamber 10 and unloading of a substrate W from the chamber 10 are performed and a shutter that opens and closes the loading/unlocking port (both of which are not illustrated) are provided in a part of the side wall 12.

As illustrated in FIG. 3, a fan filter unit (FFU) 15 is provided in the top plate portion 13 of the chamber 10. The fan filter unit 15 includes a dust collection filter such as an HEPA filter and a fan that generates an air flow. When the fan filter unit 15 is activated, air in a clean room in which the substrate processing equipment 100 is installed is taken into the fan filter unit 15, is cleaned by the dust collection filter, and is supplied to the processing space 11 in the chamber 10. Accordingly, a downflow of clean air is formed in the processing space 11 in the chamber 10.

That is, in this embodiment, the fan filter unit 15 serves as an air flow generating mechanism that generates an air flow in the chamber 10.

An exhaust duct 16 (an exhaust unit) is connected to a part of the lower portion of the side wall 12. The exhaust duct 16 includes an exhaust port 160 that is open to a space below the processing liquid collecting unit 50. The exhaust duct 16 is connected to a negative pressure source which is not illustrated. Accordingly, air supplied from the fan filter unit 15 forms a downflow inside the chamber 10 and then is suctioned into the exhaust port 160. Then, the air suctioned into the exhaust port 160 is discharged to the outside of the chamber 10 via the exhaust duct 16.

The substrate holding unit 20 is a mechanism that holds a substrate W horizontally (in a posture in which a normal line is parallel to the vertical direction) in the chamber 10. As illustrated in FIGS. 2 and 3, the substrate holding unit 20 includes a disc-shaped spin base 21 and a plurality of chuck pins 22. The chuck pins 22 are provided at equal angle intervals along the outer circumferential portion of the top surface of the spin base 21. A substrate W is held by the plurality of chuck pins 22 in a state in which a processed surface on which patterns are formed faces the upper side). The chuck pins 22 come into contact with a bottom surface and an outer circumferential end face of the edge of the substrate W and support the substrate W at a position above the top surface of the spin base 21 with a slight gap therebetween.

A chuck pin switching mechanism 23 that switches positions of the plurality of chuck pins 22 is provided in the spin base 21. The chuck pin switching mechanism 23 switches the plurality of chuck pins 22 between a holding position at which a substrate W is held and a releasing position at which holding of the substrate W is released.

The rotational mechanism 30 is a mechanism that rotates the substrate holding unit 20. The rotation mechanism 30 is accommodated in a motor cover 31 which is provided below the spin base 21. As indicated by a dotted line in FIG. 3, the rotation mechanism 30 includes a spin motor 32 and a support shaft 33. The support shaft 33 extends in the vertical direction, a bottom end portion thereof is connected to the spin motor 32, and a top end portion thereof is fixed to the center of the bottom surface of the spin base 21. When the spin motor 32 is activated, the support shaft 33 rotates about an axis 330 thereof. The substrate holding unit 20 and a substrate W held by the substrate holding unit 20 also rotate about the axis 330 along with the support shaft 33.

The processing liquid supply unit 40 is a mechanism that supplies a processing liquid to the top surface of the substrate W held by the substrate holding unit 20. As illustrated in FIGS. 2 and 3, the processing liquid supply unit 40 includes a first top surface nozzle 41, a second top surface nozzle 42, a third top surface nozzle 43, and a bottom surface nozzle 44.

The first top surface nozzle 41 includes a first nozzle arm 411, a first nozzle head 412 that is provided at the tip of the first nozzle arm 411, and a first nozzle motor 413. The second top surface nozzle 42 includes a second nozzle arm 421, a second nozzle head 422 that is provided at the tip of the second nozzle arm 421, and a second nozzle motor 423. The third top surface nozzle 43 includes a third nozzle arm 431, a third nozzle head 432 that is provided at the tip of the third nozzle arm 431, and a third nozzle motor 433.

The nozzle arms 411, 421, and 431 rotate individually in the horizontal direction about base ends of the nozzle arms 411, 421, and 431 by activating the nozzle motors 413, 423, and 433 as indicated arrows in FIG. 2. Accordingly, the nozzle heads 412, 422, and 432 can be moved between a processing position above a substrate W held by the substrate holding unit 20 and a retracted position outside the processing liquid collecting unit 50.

Figure 4:
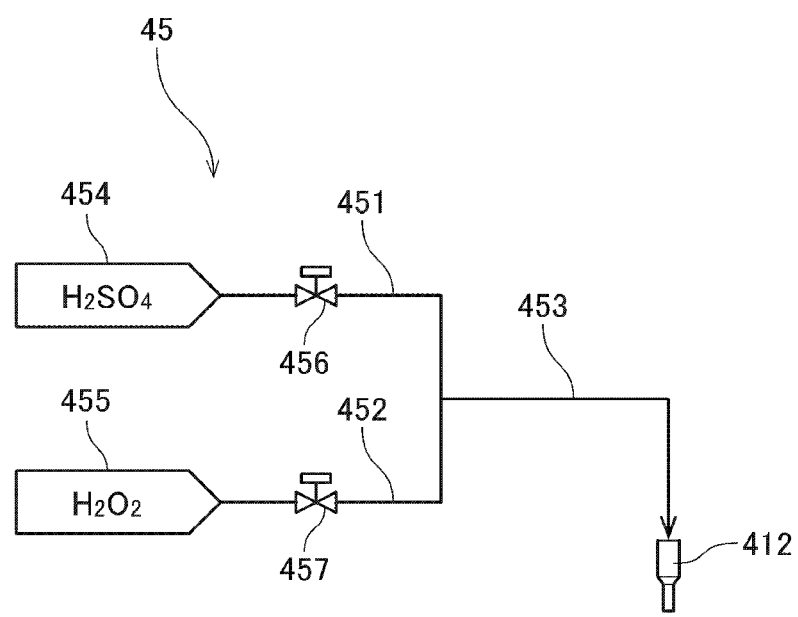
FIG. 4 is a diagram illustrating an example of a liquid supply unit which is connected to a first nozzle head.

Liquid supply units that supply a processing liquid are individually connected to the nozzle heads 412, 422, and 432. FIG. 4 is a diagram illustrating a liquid supply unit 45 connected to the first nozzle head 412. FIG. 4 illustrates an example in which an SPM cleaning solution which is a mixed solution of sulfuric acid and hydrogen peroxide water is supplied as the processing liquid.

The liquid supply unit 45 of FIG. 4 includes a first pipe 451, a second pipe 452, and a merging pipe 453. An upstream end of the first pipe 451 is connected to a sulfuric acid source 454. An upstream end of the second pipe 452 is connected to a hydrogen peroxide water source 455. Both downstream ends of the first pipe 451 and the second pipe 452 are connected to the merging pipe 453. A downstream end of the merging pipe 453 is connected to the first nozzle head 412. A first valve 456 is inserted in the way of the first pipe 451. A second valve 457 is inserted in the way of the second pipe 452.

When the first valve 456 and the second valve 457 are opened in a state in which the first nozzle head 412 is disposed at the processing position, sulfuric acid supplied from the sulfuric acid source 454 to the first pipe 451 and hydrogen peroxide water supplied from the hydrogen peroxide water source 455 to the second pipe 452 merge at the merging pipe 453 and become an SPM cleaning solution. The SPM cleaning solution is discharged from the first nozzle head 412 to the top surface of the substrate W held by the substrate holding unit 20.

The first nozzle head 412, the second nozzle head 422, and the third nozzle head 432 discharge different processing liquids. Examples of the processing liquid include an SC1 cleaning solution (a mixed solution of ammonia water, hydrogen peroxide water, and pure water), an SC2 cleaning solution (a mixed water of hydrochloric acid, hydrogen peroxide water, and pure water), a DHF cleaning solution (dilute hydrofluoric acid), and pure water (deionized water) in addition to the SPM cleaning solution.

The first nozzle head 412, the second nozzle head 422, or the third nozzle head 432 may be so-called two-fluid nozzles that mix a processing liquid and pressurized gas to generate liquid droplets and blow a mixed fluid of the droplets and the gas to the substrate W. The number of top surface nozzles disposed in the processing unit 102 is not limited to three, and may be one, two, or four or more.

The bottom surface nozzle 44 is disposed inside a through-hole which is installed at the center of the spin base 21. A discharge port of the bottom surface nozzle 44 faces the bottom surface of the substrate W which is held by the substrate holding unit 20. The bottom surface nozzle 44 is connected to a liquid supply unit that supplies a processing liquid. When a processing liquid is supplied from the liquid supply unit to the bottom surface nozzle 44, the processing liquid is discharged from the bottom surface nozzle 44 to the bottom surface of the substrate W.

The processing liquid collecting unit 50 is a part that collects used processing liquids. As illustrated in FIG. 3, the processing liquid collecting unit 50 includes an inner cup 51, a middle cup 52, and an outer cup 53. The substrate W is surrounded with the cups 51 to 53 threefold. The inner cup 51, the middle cup 52, and the outer cup 53 can be independently moved upward and downward by a cup lifting mechanism 54 which is conceptually illustrated in FIG. 3.

The inner cup 51 includes an annular first guide plate 510 that surrounds the substrate holding unit 20. The middle cup 52 includes an annular second guide plate 520 that is located outside and above the first guide plate 510. The outer cup 53 includes an annular third guide plate 530 that is located outside and above the second guide plate 520. The bottom of the inner cup 51 extends to the bottoms of the middle cup 52 and the outer cup 53. On the top surfaces of the bottom portions, a first discharged liquid groove 511, a second discharged liquid groove 512, and a third discharged liquid groove 513 are sequentially provided from the inner side.

Processing liquids discharged from the nozzles 41, 42, 43, and 44 of the processing liquid supply unit 40 are supplied to the substrate W and fly outward due to a centrifugal force from rotation of the substrate W. The processing liquid flying from the substrate W is collected in one of the first guide plate 510, the second guide plate 520, and the third guide plate 530. The processing liquid collected in the first guide plate 510 is discharged to the outside of the processing unit 102 via the first discharged liquid groove 511. The processing liquid collected in the second guide plate 520 is discharged to the outside of the processing unit 102 via the second discharged liquid groove 512. The processing liquid collected in the third guide plate 530 is discharged to the outside of the processing unit 102 via the third discharged liquid groove 513.

In this way, the processing unit 102 includes a plurality of routes for discharging processing liquids. Accordingly, each kind of processing liquid supplied to a substrate W can be individually recovered. Therefore, processes of disposing or recycling the recovered processing liquids can be separately performed depending on features of the processing liquids. For example, the first discharged liquid groove 511 is connected to a waste liquid line for disposing of a processing liquid. Accordingly, the processing liquid collected by the first guide plate 510 of the inner cup 51 can be discharged to the waste liquid line via the first discharged liquid groove 511. The second discharged liquid groove 512 is connected to a recycle line for recycling a processing liquid. Accordingly, the processing liquid collected by the second guide plate 520 of the middle cup 52 can be discharged to the recycle line via the second discharged liquid groove 512.

An annular wall 55 is disposed outside the outer cup 53. The annular wall 55 is a ring-shaped wall that surrounds the outer cup 53. An annular protruding portion 551 that protrudes inward is disposed on the top of the annular wall 55. Air which forms a downflow in the chamber 10 flows to a lower space via the inside of the inner cup 51, the inside of the middle cup 52, the inside of the outer cup 53, or a space between the outer cup 53 and the annular wall 55. The air flowing downward is suctioned into the exhaust duct 16 via the exhaust port 160.

The blocking plate 60 is a member that curbs diffusion of a gas in the vicinity of the surface of the substrate W when some processes such as a drying process are performed. The blocking plate 60 has a disc shape and is disposed horizontally above the substrate holding unit 20. As illustrated in FIG. 3, the blocking plate 60 is connected to a blocking plate lifting mechanism 61. When the blocking plate lifting mechanism 61 is activated, the blocking plate 60 moves upward and downward between an upper position which is separated upward from the top surface of the substrate W held by the substrate holding unit 20 and a lower position which is closer to the top surface of the substrate W than the upper position. For example, a mechanism that converts a rotational motion of a motor into a translational motion using a ball screw is used as the blocking plate lifting mechanism 61.

A blowout port 62 that blows an inert gas such as nitrogen gas is disposed at the center of the bottom surface of the blocking plate 60. The blowout port 62 is connected to a gas supply unit (not illustrated) that supplies a drying gas.

When a processing liquid is supplied from the first top surface nozzle 41, the second top surface nozzle 42, or the third top surface nozzle 43 to the substrate W, the blocking plate 60 retracts to the upper position. When a drying process of the substrate W is performed after the processing liquid has been supplied, the blocking plate 60 is moved downward to the lower position by the blocking plate lifting mechanism 61. Then, a drying gas (for example, heated nitrogen gas) is blown from the blowout port 62 to the top surface of the substrate W. At this time, diffusion of the gas is curbed by the blocking plate 60. As a result, the drying gas is efficiently supplied to the top surface of the substrate W.

The imaging unit 70 is a device that captures an image of a predetermined imaging area in the chamber 10. The imaging unit 70 is installed, for example, at a position close to the inner surface of the side wall 12 of the chamber 10. As illustrated in FIGS. 2 and 3, the imaging unit 70 includes a light source 71 and a camera 72. For example, an LED is used as the light source 71. For example, a digital camera including an imaging element such as a charge coupled device (CCD) or complementary metal oxide semiconductor (CMOS) is used as the camera 72. The imaging unit 70 acquires a captured image of the imaging area A1 which is set in advance in the processing space 11 in the chamber 10 by capturing an image using the camera 72 while emitting light from the light source 71. The captured image is constituted by a plurality of pixels and includes information of a pixel value for each pixel.

Figure 5:
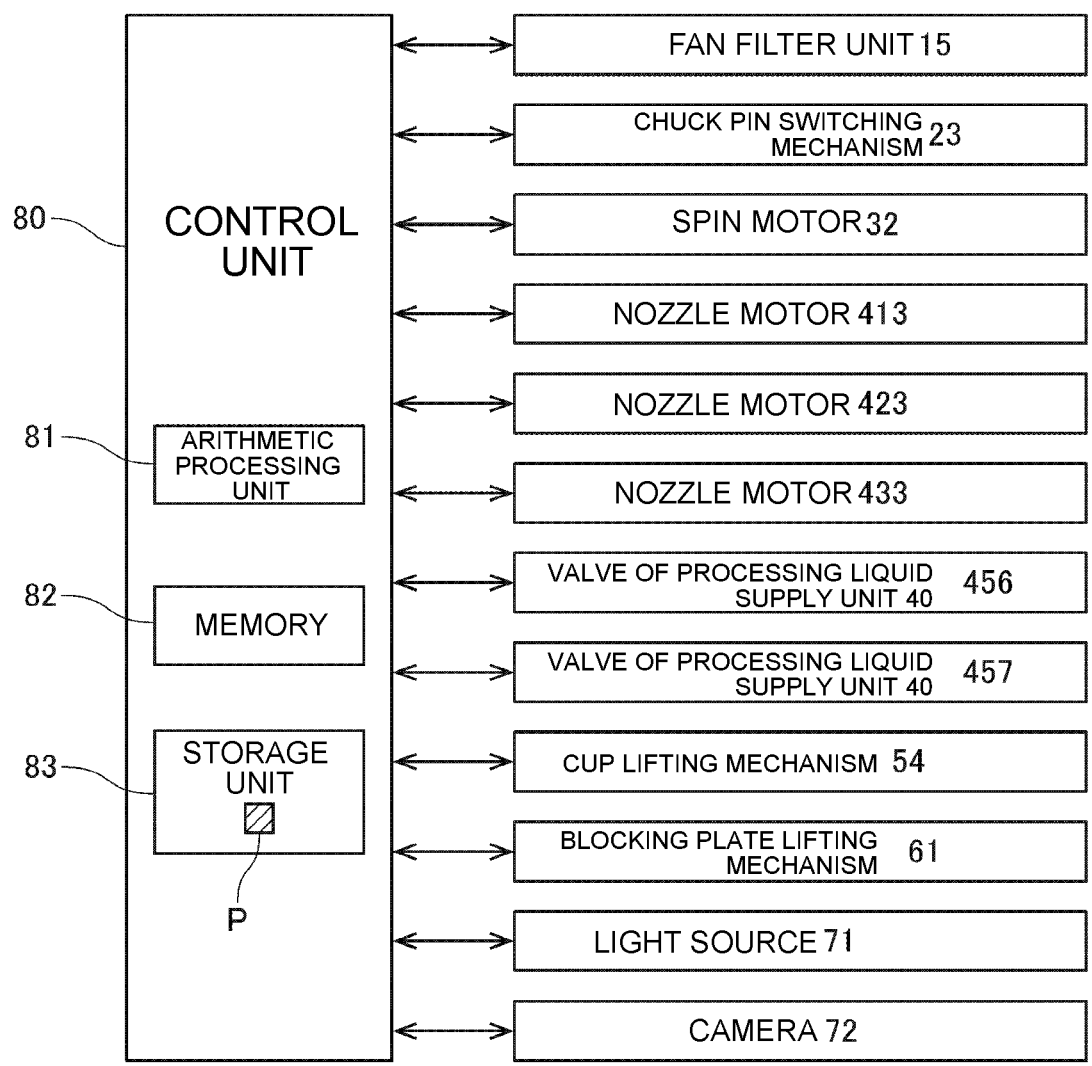
FIG. 5 is a block diagram illustrating connections between constituent elements in a control unit and a processing unit.

The control unit 80 is a means that controls operations of the constituent elements of the processing unit 102. FIG. 5 is a block diagram illustrating connections between constituent elements in the control unit 80 and the processing unit 102. As conceptually illustrated in FIG. 5, the control unit 80 is constituted by a computer including an arithmetic processing unit 81 such as a CPU, a memory 82 such as a RAM, and a storage unit 83 such as a hard disk drive. A computer program P for executing processing of a substrate W in the processing unit 102 is installed in the storage unit 83.

As illustrated in FIG. 5, the control unit 80 is communicatively connected to the fan filter unit 15, the chuck pin switching mechanism 23, the spin motor 32, the nozzle motors 413, 423, and 433, the valves 456 and 457 of the processing liquid supply unit 40, the cup lifting mechanism 54, the blocking plate lifting mechanism 61, the light source 71, and the camera 72. The control unit 80 controls operations of the constituent elements by temporarily reading the computer program P or data stored in the storage unit 83 into the memory 82 and causing the arithmetic processing unit 81 to perform arithmetic operations based on the computer program P. Accordingly, processing of a substrate W in the processing unit 102 or a fume determination process which will be described later is performed.

<3. Operation of Substrate Processing Equipment>

Figure 6:
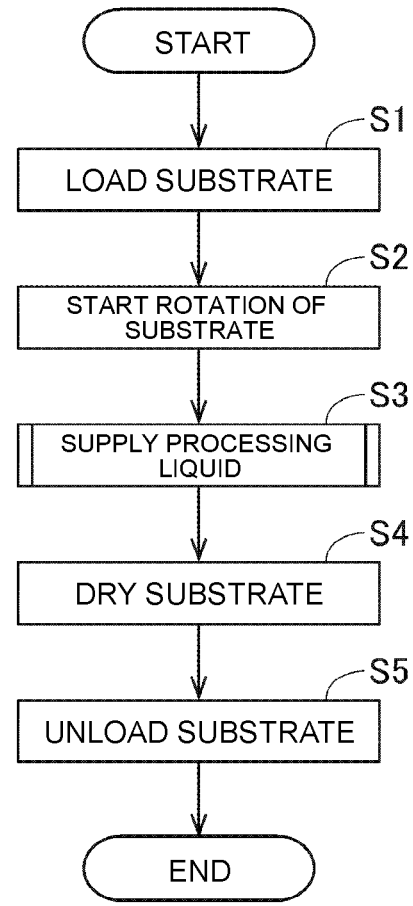
FIG. 6 is a flowchart illustrating a flow of substrate processing in the processing unit.

Processing of a substrate W in the processing unit 102 will be described below with reference to the flowchart illustrated in FIG. 6.

When the processing unit 102 processes a substrate W, first, the main delivery robot 103 loads a substrate W to be processed into the chamber 10 (Step S1). The substrate W loaded into the chamber 10 is held horizontally by a plurality of chuck pins 22 of the substrate holding unit 20. Thereafter, by driving the spin motor 32 of the rotation mechanism 30, rotation of the substrate W is started (Step S2). Specifically, the support shaft 33, the spin base 21, a plurality of chuck pins 22, and the substrate W held by the chuck pins 22 rotate about the axis 330 of the support shaft 33.

Subsequently, supply of a processing liquid from the processing liquid supply unit 40 is performed (Step S3). In Step S3, the first nozzle head 412, the second nozzle head 422, and the third nozzle head 432 move sequentially to a processing position facing the top surface of the substrate W by driving the nozzle motors 413, 423, and 433. Then, the processing liquid is discharged from the nozzle head disposed at the processing position. A sequence of supply of the processing liquids or a time of supply of each processing liquid is set in advance in the storage unit 83 of the control unit 80. The control unit 80 performs an operation of discharging the processing liquids from the top surface nozzles 41, 42, and 43 based on the settings.

In Step S3, the nozzles 41, 42, and 43 may be oscillated horizontally at the processing position while the processing liquids are discharged from the nozzles 41, 42, and 43. If necessary, discharge of a processing liquid from the bottom surface nozzle 44 may be performed.

Figure 7:
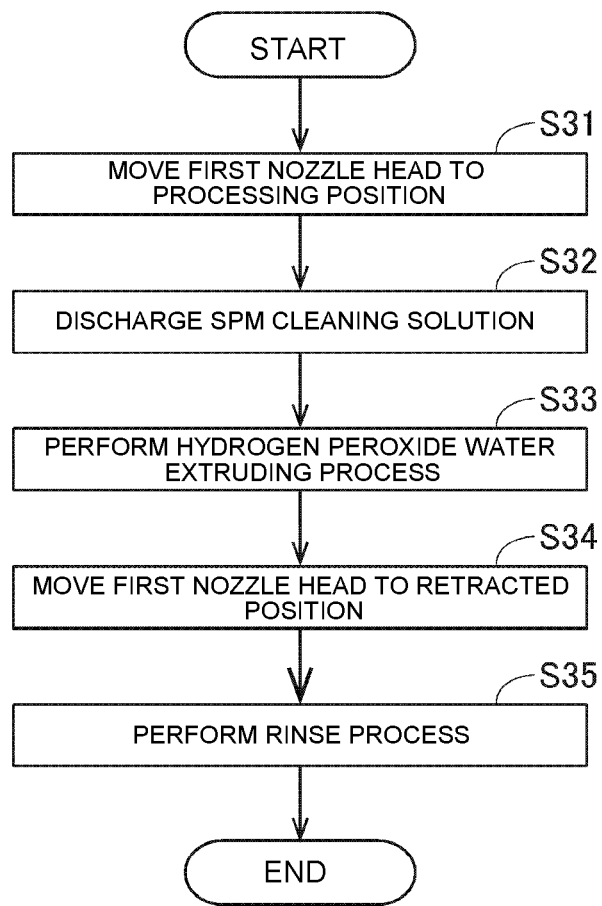
FIG. 7 is a flowchart illustrating a part of a processing liquid supply process.

FIG. 7 is a flowchart illustrating a part of a processing liquid supplying process in Step S3. In the example illustrated in FIG. 7, first, the first nozzle arm 411 rotates and the first nozzle head 412 moves from a retracted position to the processing position (Step S31). Then, the first valve 456 and the second valve 457 illustrated in FIG. 4 are opened. Accordingly, an SPM cleaning solution which is a mixed solution of sulfuric acid and hydrogen peroxide water is discharged from the first nozzle head 412 to the top surface of the substrate W (Step S32). The temperature of the SPM cleaning solution may range, for example, from 150° C. to 200° C.

Figure 8:
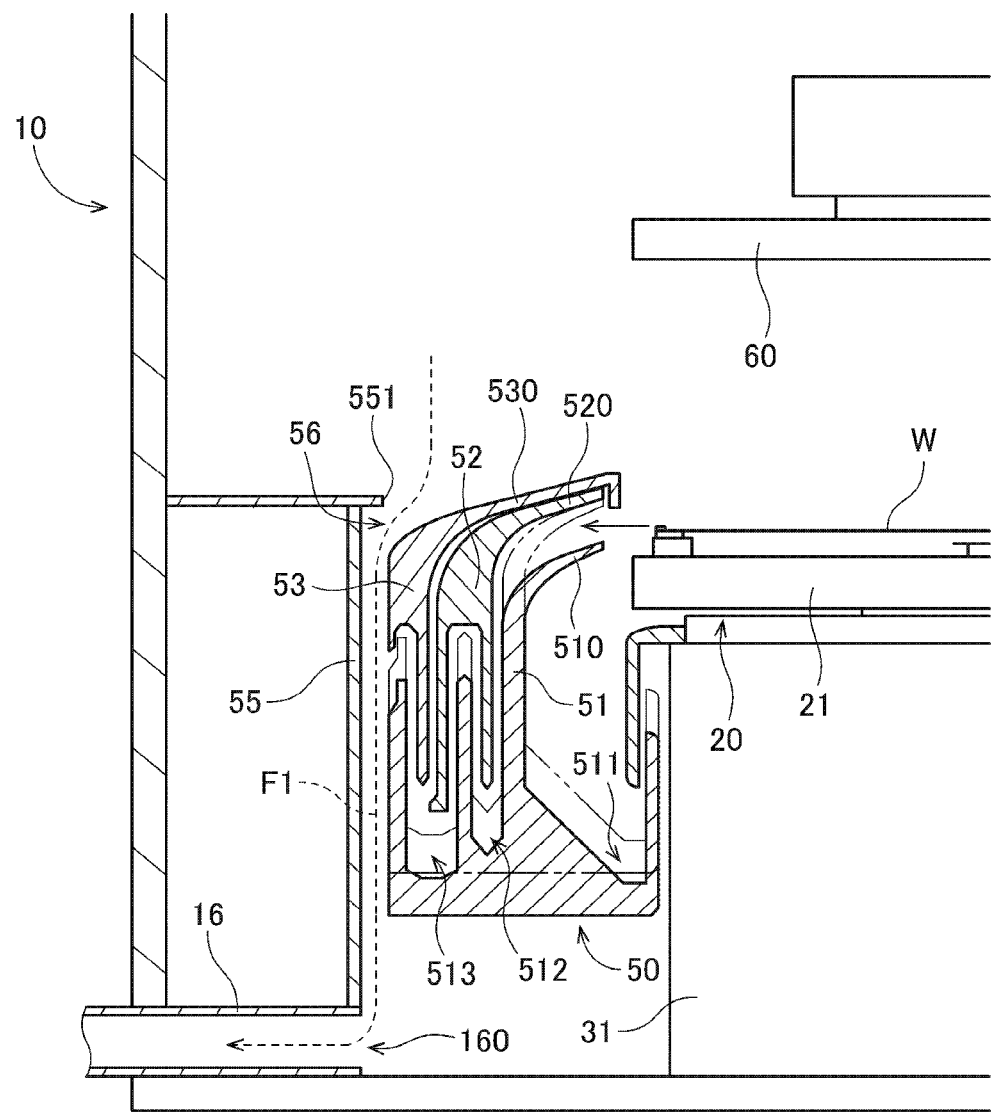
FIG. 8 is a partial longitudinal sectional view of the processing unit in Step S32.

FIG. 8 is a partial longitudinal sectional view of the processing unit 102 in Step S32. In Step S32, when the SPM cleaning solution is supplied to the top surface of the substrate W, a resist covering the top surface of the substrate W is dissolved in the SPM cleaning solution. Accordingly, at the beginning of discharge of the SPM cleaning solution, a black SPM cleaning solution including components of the resist flies laterally from the top surface of the substrate W. At this time, as indicated by an alternate long and two-short dash line in FIG. 8, the first guide plate 510 of the inner cup 51 is disposed beside the substrate W. The SPM cleaning solution flying from the top surface of the substrate W is collected by the inner cup 51 and is discharged to the waste liquid line via the first discharged liquid groove 511.

When the resist is completely removed from the top surface of the substrate W, the liquid flying from the top surface of the substrate W is almost a pure colorless and transparent SPM cleaning solution. When change in color of the SPM cleaning solution is detected by a sensor which is not illustrated, the control unit 80 moves the inner cup 51 downward using the cup lifting mechanism 54. Specifically, as indicated by a solid line in FIG. 8, the first guide plate 510 of the inner cup 51 is disposed at a position lower than the substrate W. Then, the SPM cleaning solution flying from the top surface of the substrate W is collected by the middle cup 52 and is recovered to the recycle line via the second discharged liquid groove 512.

When discharge of the SPM cleaning solution for a predetermined time is completed, only the first valve 456 out of the first valve 456 and the second valve 457 is closed to stop supply of sulfuric acid. Accordingly, a so-called "hydrogen peroxide water extruding process" of discharging only hydrogen peroxide water from the first nozzle head 412 is performed (Step S33). The hydrogen peroxide water extruding process is performed to wash out a sulfuric acid component remaining in the merging pipe 453 and the first nozzle head 412 and to prevent unintentional dropping of sulfuric acid from the first nozzle head 412 after supply of the processing liquid has been stopped.

Thereafter, when a predetermined time elapses, the second valve 457 is also closed to stop discharge of hydrogen peroxide water. Then, the first nozzle arm 411 is rotated to move the first nozzle head 412 from the processing position to the retracted position (Step S34).

Thereafter, a rinse process is performed on the substrate W (Step S35). In the rinse process, pure water is discharged to the top surface of the substrate W while maintaining rotation of the substrate W. Pure water may be discharged from any one of the first to third nozzle heads 412 to 432 or may be discharged from the center of the bottom surface of the blocking plate 60.

The description below will refer back to the flowchart of FIG. 6. In the process of supplying a processing liquid in Step S3, the blocking plate 60 is disposed at the upper position which is higher than the top surface nozzles 41, 42, and 43. When supply of various processing liquids to the substrate W has been completed and all the top surface nozzles 41, 42, and 43 are disposed at the retracted position, the control unit 80 activates the blocking plate lifting mechanism 61 to move the blocking plate 60 from the upper position to the lower position. Then, a rotational speed of the spin motor 32 is increased to increase the rotational speed of the substrate W and a drying gas is blown to the substrate W from the blowout port 62 disposed on the bottom surface of the blocking plate 60. Accordingly, the surface of the substrate W is dried (Step S4).

When the drying process of the substrate W ends, holding of the substrate W by the plurality of chuck pins 22 is released. Then, the main delivery robot 103 takes the processed substrate W out of the substrate holding unit 20 and unloads the substrate W to the outside of the chamber 10 (Step S5).

<4. Fume Determination Process>

In the process of supplying a processing liquid in Step S3, an atmosphere including a plurality of particulates which is called fumes may be generated in a space above the substrate W. Particularly, as in the example illustrated in FIG. 7, when an SPM cleaning solution of 150° C. or higher is supplied and the hydrogen peroxide water extruding process is performed after the SPM cleaning solution has been supplied, it is known that a large amount of fumes can be easily generated.

When the amount of fumes generated is normal, diffusion of fumes is curbed by the downflow in the chamber 10. However, when the amount of fumes generated is excessively large and fumes are attached, for example, to the blocking plate 60, the attached fumes are finally solidified and become particles. Then, there is concern that the particles may fly again from the blocking plate 60 and may be attached as foreign substance to the surface of the substrate W. Therefore, the processing unit 102 according to this embodiment performs a process of monitoring a captured image in the chamber 10 and determining whether a generation status of fumes is in a normal range together in the process of Step S3. The determination process will be described below.

Figure 9:
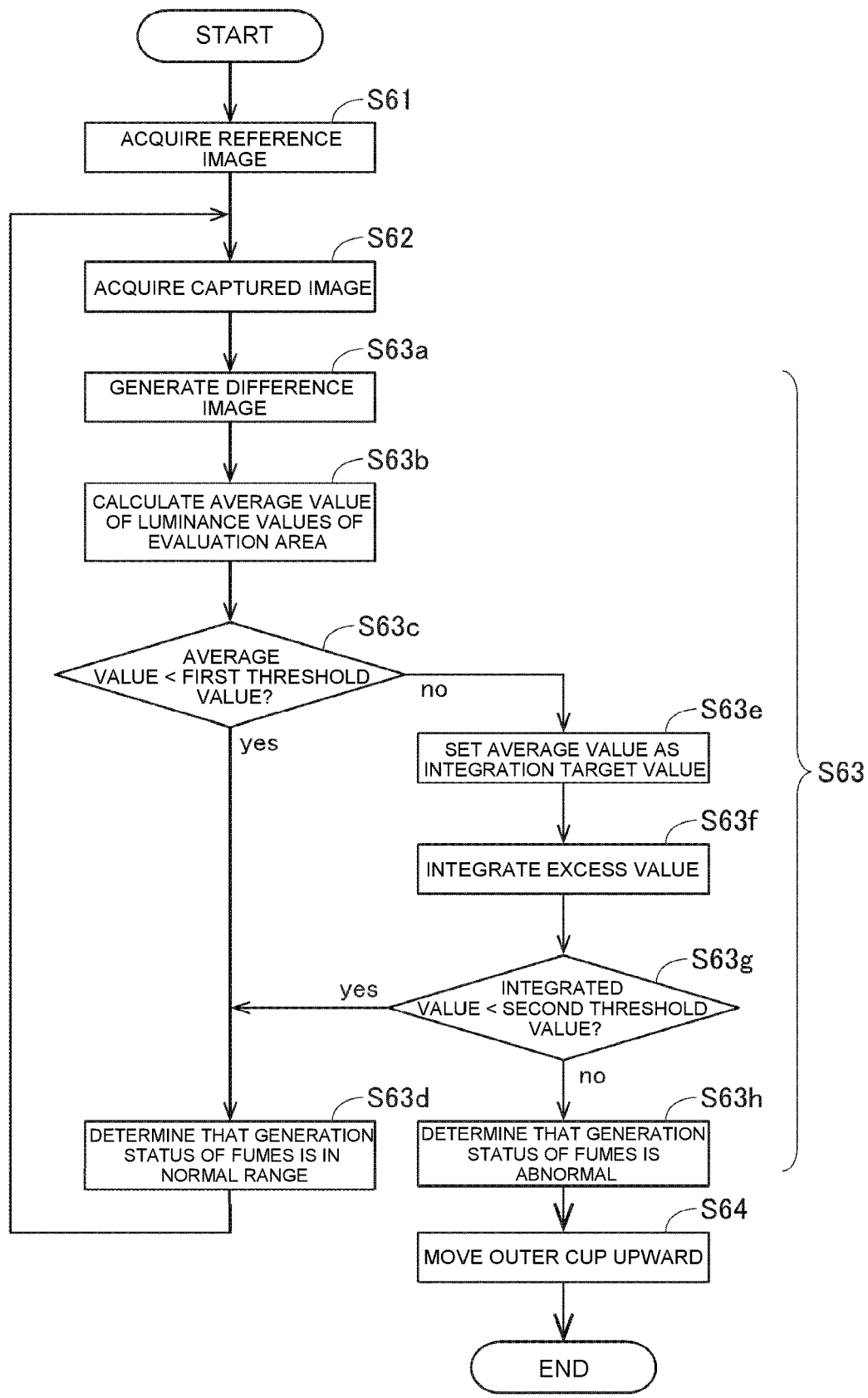
FIG. 9 is a flowchart illustrating a flow of a fume determination process.

FIG. 9 is a flowchart illustrating a flow of the fume determination process.

When the fume determination process is performed, first, a reference image Ir is acquired (Step S61). Specifically, before supply of a processing liquid to a substrate W is started, the imaging unit 70 captures an image of a predetermined imaging area A1 above the substrate W. An image of the imaging area A1 in which there is no fume is acquired as a reference image Ir by this capturing of an image. The acquired reference image Ir is input from the imaging unit 70 to the control unit 80 and is stored in the storage unit 83 of the control unit 80.

When supply of a processing liquid to the substrate W is started, the imaging unit 70 repeatedly captures an image of the imaging area A1 in the chamber 10 at predetermined time intervals (for example, every 0.1 seconds). Accordingly, an image (hereinafter referred to as a "captured image Is") of the imaging area A1 after supply of a processing liquid has been started is repeatedly acquired (Step S62). The acquired captured image Is is input from the imaging unit 70 to the control unit 80 and is stored in the storage unit 83 of the control unit 80.

Figure 10:
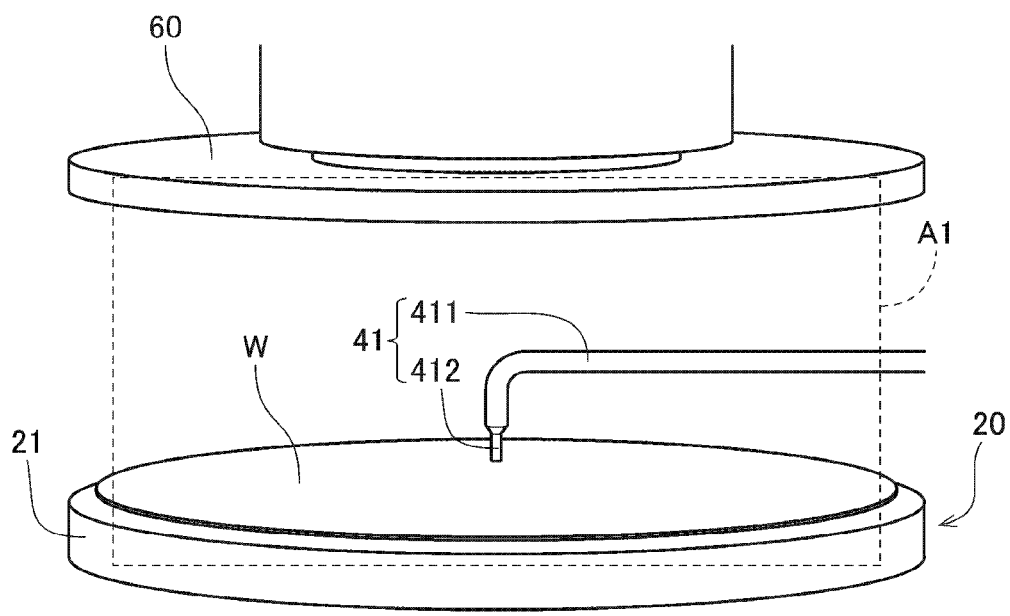
FIG. 10 is a perspective view of a substrate holding unit, a substrate, and a blocking plate when seen from a camera.

FIG. 10 is a perspective view of the substrate holding unit 20, a substrate W, and the blocking plate 60 when seen from the camera 72. As indicated by a dotted line in FIG. 10, the imaging area A1 is set to include, for example, a space between the substrate holding unit 20 and the blocking plate 60 disposed at the upper position.

Figure 11:
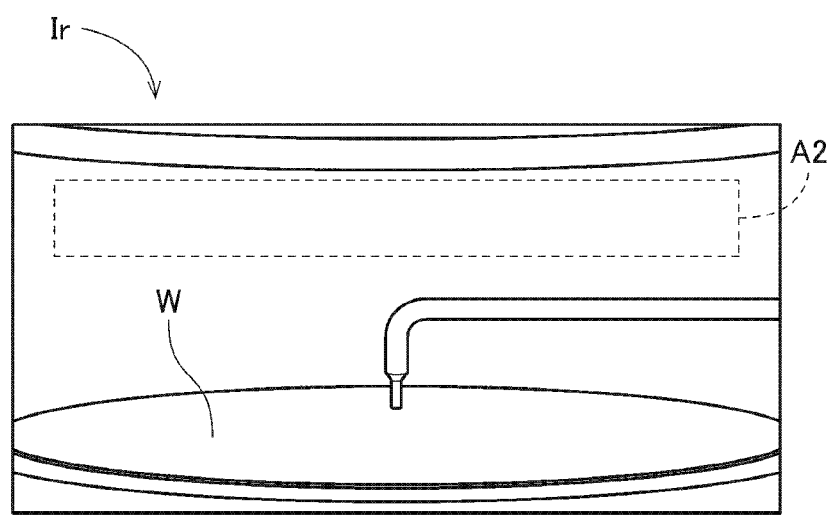
FIG. 11 is a diagram illustrating an example of a reference image.
Figure 12:
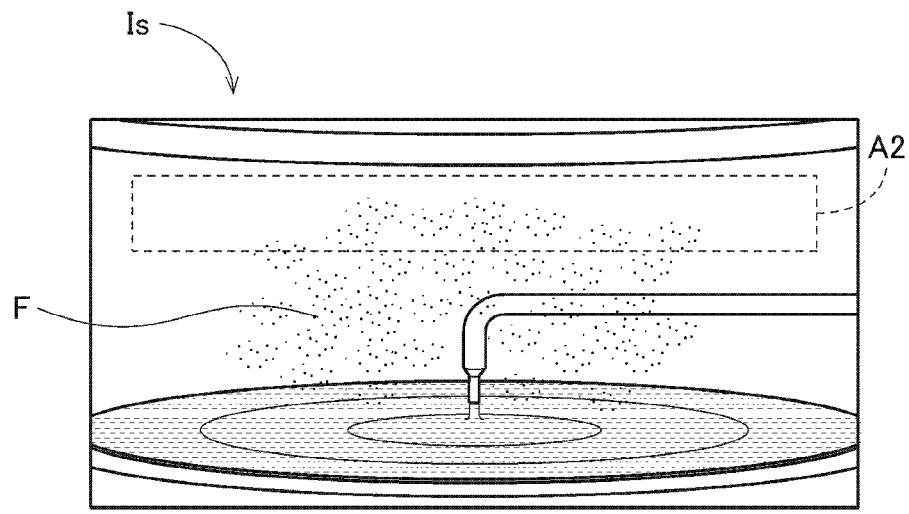
FIG. 12 is a diagram illustrating an example of a captured image.

FIG. 11 is a diagram illustrating an example of a reference image Ir which is acquired in Step S61. FIG. 12 is a diagram illustrating an example of a captured image Is which is acquired in Step S62. As illustrated in FIGS. 11 and 12, the imaging area A1 includes at least one evaluation area A2. The evaluation area A2 is an area which is determined in Step S63 in the imaging area A1. The evaluation area A2 is set in advance by a user. It is preferable that the evaluation area A2 be set to include a space above the substrate W which is held horizontally by the substrate holding unit 20. Particularly, as in this embodiment, when the processing unit 102 includes the blocking plate 60, it is preferable that the evaluation area A2 be set to include a space close to the bottom surface of the blocking plate 60 as illustrated in FIGS. 11 and 12.

When a captured image Is is acquired, the control unit 80 determines a generation status of fumes in the evaluation area A2 based on luminance values included in the captured image Is (Step S63). As illustrated in FIG. 9, Step S63 in this embodiment includes Steps S63a to S63h.

In Step S63, first, the control unit 80 generates a difference image Id in luminance value between the reference image Ir and the acquired captured image Is (Step S63a). Specifically, a difference value between a luminance value of a pixel included in the reference image Ir and a luminance value of the corresponding pixel included in the captured image Is is calculated for each pixel and an image constituted by the calculated difference values is set as a difference image Id.

Figure 13:
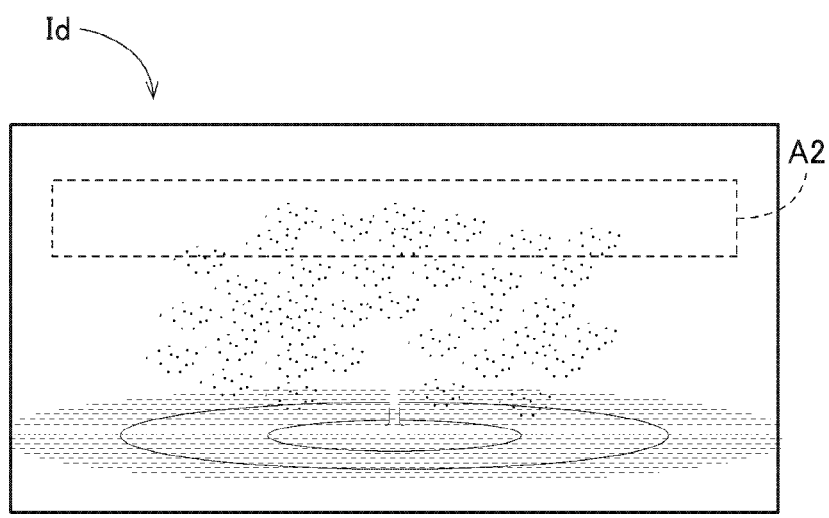
FIG. 13 is a diagram illustrating an example of a difference image.

FIG. 13 is a diagram illustrating an example of a difference image Id which is generated based on the reference image Ir illustrated in FIG. 11 and the captured image Is illustrated in FIG. 12. In the difference image Id, the luminance value of a pixel having no change between the reference image Ir and the captured image Is is almost zero and only a pixel having a change has a nonzero luminance value. Accordingly, when fumes F are generated, the luminance values of the difference image Id are positive numbers other than zero.

The control unit 80 sequentially generates such a difference image Id for a plurality of captured images Is which are repeatedly acquired by the imaging unit 70.

Figure 14:
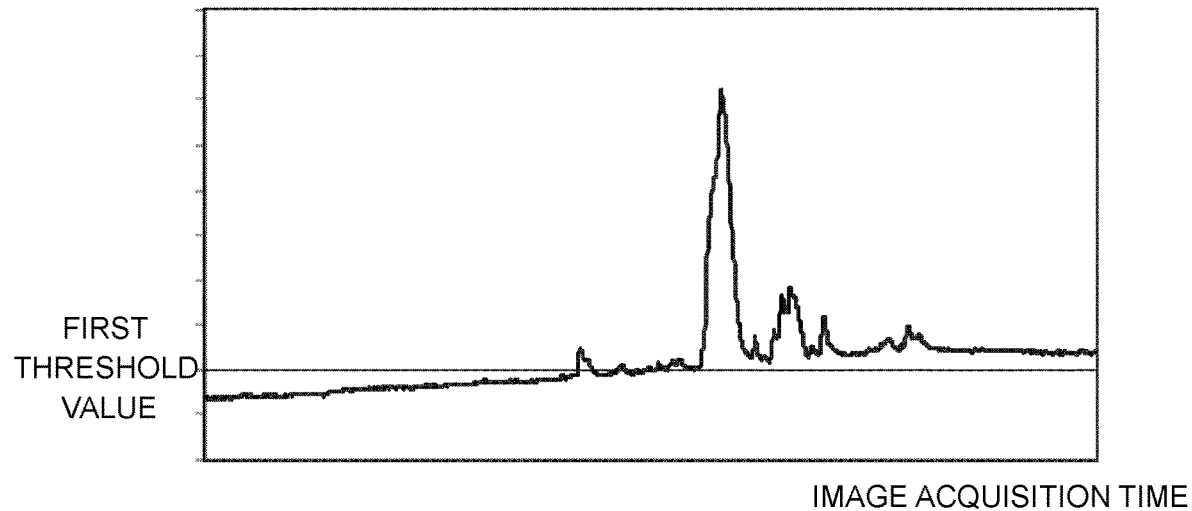
FIG. 14 is a diagram illustrating an example of data indicating change of an average value of luminance values in an evaluation area.

Subsequently, the control unit 80 calculates an average value of luminance values of the pixels in the evaluation area A2 for the difference images Id which are sequentially acquired (Step S63b). As a result, as illustrated in FIG. 14, data indicating change of the average value of the luminance values of the evaluation area A2 with respect to the acquisition time of the captured image Is is acquired. The control unit 80 compares the calculated average value with a preset first threshold value (Step S63c). Then, when the average value is less than the first threshold value, the control unit 80 determines that the generation status of fumes at that time is in a normal range (Step S63d). On the other hand, when the average value is equal to or greater than the first threshold value, the control unit 80 determines that the average value is set as an integration target value (Step S63e).

Figure 15:
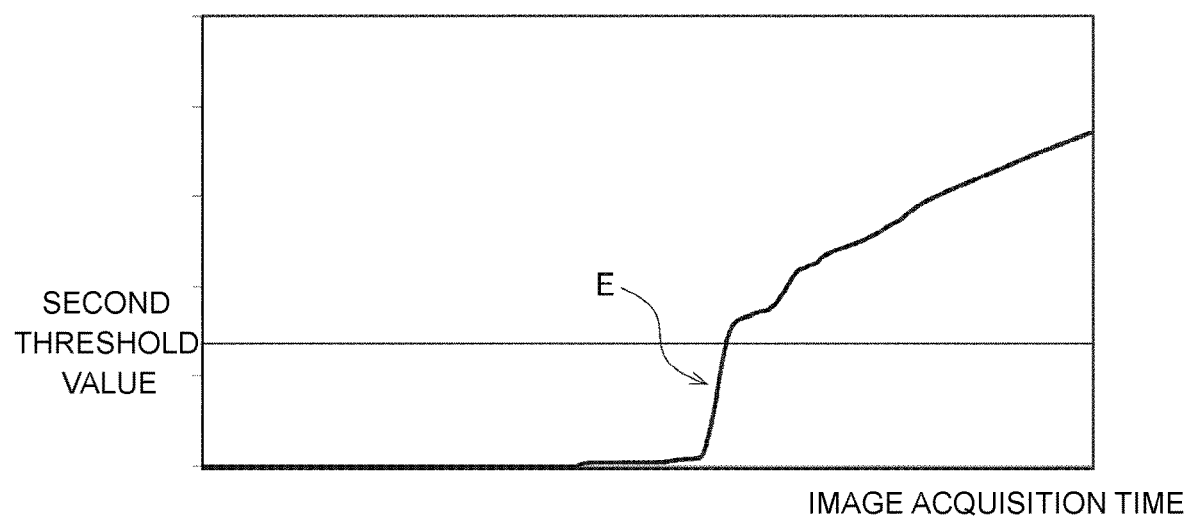
FIG. 15 is a diagram illustrating an example of data indicating change of an integrated value.

Thereafter, the control unit 80 sequentially integrates an excess value which is obtained by subtracting the first threshold value from the integration target value (Step S63f). Accordingly, as illustrated in FIG. 15, data indicating change of the integrated value obtained by integrating the excess value is acquired. The control unit 80 compares the calculated integrated value with a preset second threshold value (Step S63g). When the integrated value is less than the second threshold value, the control unit 80 determines that the generation status of fumes at that time is in a normal range (Step S63d). On the other hand, when the integrated value is equal to or greater than the second threshold value, the control unit 80 determines that the generation status of fumes in the evaluation area A2 is abnormal (Step S63h).

When it is determined in Step S63d that the generation status of fumes is in the normal range, the process flow returns to Step S62 and the control unit 80 performs acquisition of a captured image Is (Step s62) and the fume determination process (Step S63). On the other hand, when it is determined in Step S63h that the generation of fumes is abnormal, the control unit 80 issues an alarm to notify a user of abnormality. The alarm may be, for example, emission of light from a warning lamp, emission of voice or warning sound, or display of a message on a screen.

As described above, in the processing unit 102, it is possible to quantitatively determine whether the generation status of fumes in the chamber 10 is in a normal range based on the luminance values of a captured image Is. Accordingly, a user can appropriately ascertain the generation status of fumes in the chamber based on the result of determination and can take necessary measures at the time of abnormality.

Particularly, in this embodiment, a reference image Ir is acquired in advance and the generation status of fumes is determined based on a difference image Id between the reference image Ir and a captured image Is. Accordingly, a part which is different between the reference image Ir and the captured image Is can be appropriately determined as fumes.

In this embodiment, as well as comparing the average value of luminance values in an evaluation area A2 with the first threshold value, an excess value is integrated and the integrated value obtained by integration is compared with the second threshold value only when the average value is equal to or greater than the first threshold value. Accordingly, it is not determined that the generation status of fumes is abnormal immediately when the average value of luminance values in the evaluation area A2 is temporarily equal to or greater than the first threshold value due to a measurement error or the like, and it can be determined that the generation status of fumes is abnormal only when a state in which the average value is equal to or greater than the first threshold value is maintained to a certain extent. Accordingly, it is possible to more stably determine whether the generation status of fumes in the chamber 10 is in a normal range.

In Step S63f in this embodiment, the excess value which is obtained by subtracting the first threshold value from the integration target value is sequentially integrated. However, the integration target value instead of the excess value may be sequentially integrated. However, when the excess value is integrated as described above, the rate of change at the time at which fumes are abnormally generated (for example, the rate of change in the part indicated by reference sign E in FIG. 15) can be intensified and emphasized, which is preferable.

<5. Operation of Lifting Outer Cup>

The height of the outer cup 53 is disposed at a first position illustrated in FIG. 8 at the time of normality. At the first position, the third guide plate 530 of the outer cup 53 is disposed around the substrate W. At this time, an annular gap 56 is formed between the outer cup 53 and the annular wall 55 located outside the outer cup 53. Air which forms a downflow in the chamber 10 flows to a space below three cups 51 to 53 mainly via the gap 56 as indicated by a dotted arrow F1 in FIG. 8.

However, when it is determined in Step S63h of FIG. 9 that the generation status of fumes is abnormal, the control unit 80 moves the outer cup 53 upward using the cup lifting mechanism 54 (Step S64). Accordingly, the height of the outer cup 53 can be changed from the first position to a second position which is higher than the first position.

Figure 16:
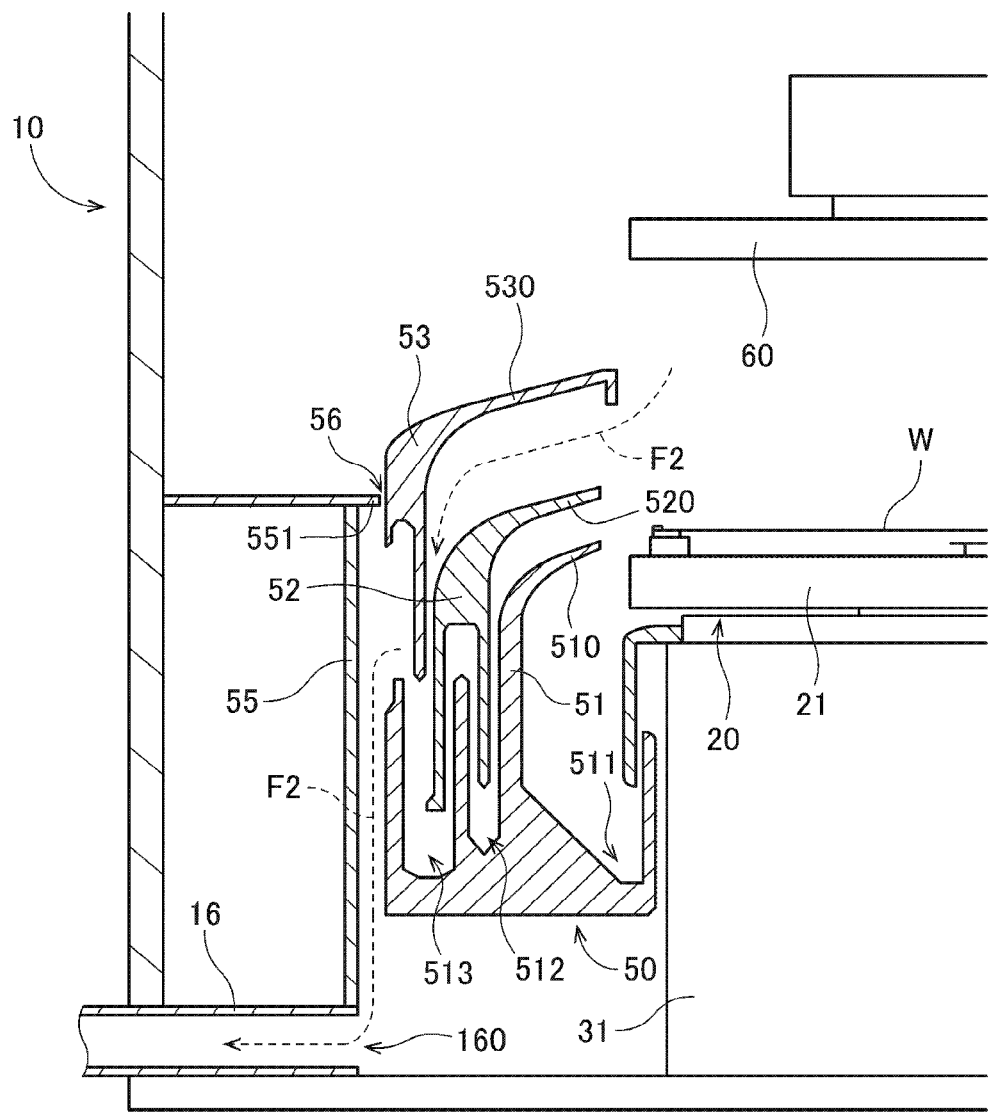
FIG. 16 is a partial longitudinal sectional view of the processing unit in Step S64.

FIG. 16 is a partial longitudinal sectional view of the processing unit 102 in Step S64. As illustrated in FIG. 16, at the second position, the third guide plate 530 of the outer cup 53 is disposed outside a space corresponding to the evaluation area A2 above the substrate W. When the outer cup 53 is disposed at the second position, the outer circumferential surface of the outer cup 53 approaches the inner circumferential portion of the annular protruding portion 551 of the annular wall 55. Accordingly, the gap 56 between the outer cup 53 and the annular wall 55 is narrower than that at the first position. Accordingly, air which forms a downflow in the chamber 10 flows to the space below three cups 51 to 53 mainly via the inside of the outer cup 53 as indicated by a dotted arrow F2 in FIG. 16.

Fumes which are generated in the space above the substrate W are carried by the air flow indicated by the dotted arrow F2 and are collected by the outer cup 53. Accordingly, upward diffusion of fumes is curbed. As a result, it is possible to curb attachment of fumes to the bottom surface of the blocking plate 60, the outer circumferential surface of the outer cup 53, the inner wall surface of the chamber 10, and the like.

In this way, in the processing unit 102 according to this embodiment, the position of the outer cup 53 in the vertical direction is changed based on the determination result of Step S63. Accordingly, the outer cup 53 is disposed at an appropriate position based on the generation status of fumes. As a result, it is possible to curb diffusion of fumes and to prevent fumes from being attached to the constituent elements of the chamber 10. Particularly, in this embodiment, the gap 56 between the outer cup 53 and the annular wall 55 at the second position after the outer cup 53 has moved upward is smaller than the gap 56 between the outer cup 53 and the annular wall 55 at the first position before the outer cup 53 has moved upward. In this way, by narrowing the gap 56 when it is determined that the generation status of fumes is abnormal, it is possible to reduce a flow rate of a gas flowing outside the outer cup 53. As a result, it is possible to further curb diffusion of fumes.

In this embodiment, the inner cup 51 and the middle cup 52 from three cups 51 to 53 of the processing liquid collecting unit 50 operate in accordance with a preset processing sequence regardless of the determination result of Step S63. Only the outer cup 53 which is located at the outermost moves upward and downward based on the determination result of Step S63. Accordingly, it is possible to collect generated fumes using the outer cup 53 while collecting processing liquids using the inner cup 51 and the middle cup 52.

<6. Modified Example>

While an embodiment of the disclosure has been described above, the disclosure is not limited to the embodiment.

In the above-mentioned embodiment, when it is determined in Step S63h that the generation status of fumes is abnormal, an alarm is issued and the position of the outer cup 53 in the vertical direction is changed from the first position to the second position in order to curb diffusion of fumes. However, the position of the outer cup 53 in the vertical direction may be changed in three or more stages or may be changed continuously. The cup of which the position in the vertical direction is changed may be the inner cup 51 or the middle cup 52. The height of the outer cup 53 may be fixed at the second position. The number of cups that surround the substrate W may be 1 or 2 or may be equal to or greater than 4. In addition to the three cups 51 to 53, a dedicated cup for collecting fumes may be provided.

Figure 17:
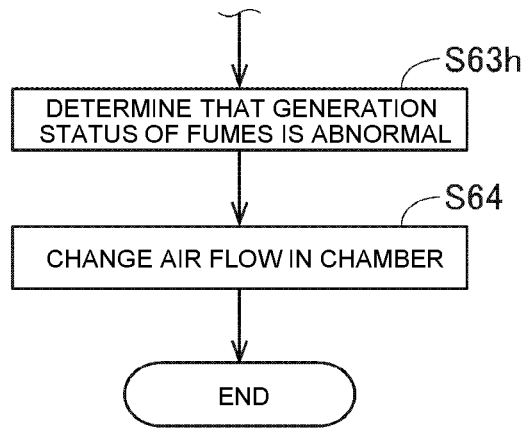
FIG. 17 is a flowchart when a gas flow in a chamber is changed after determination of an abnormality.

When it is determined in Step S63h that the generation status of fumes is abnormal, the control unit 80 may issue an alarm and automatically perform other control for curbing diffusion of fumes. For example, as illustrated in FIG. 17, an air flow in the chamber 10 may be changed after Step S63h (Step S64). Specifically, the rotation speed of the fan of the fan filter unit 15 can be increased to increase a flow rate of the downflow in the chamber 10.

Figure 18:
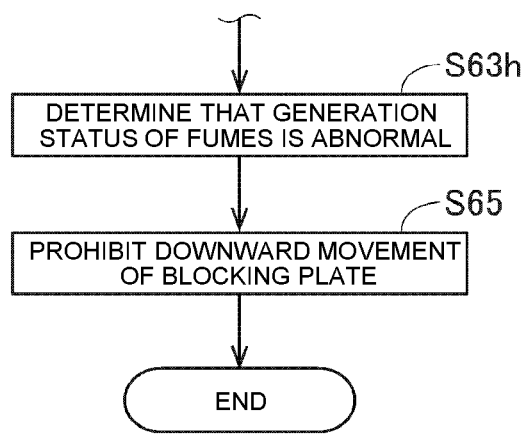
FIG. 18 is a flowchart when downward movement of a blocking plate is prohibited after determination of an abnormality.

When it is determined in Step S63h that the generation status of fumes is abnormal, it is thought that fumes diffuse to an area close to the bottom surface of the blocking plate 60. Accordingly, when it is scheduled to perform the drying process of Step S4 immediately thereafter and the blocking plate 60 is moved downward as it were, fumes are attached to the blocking plate 60. Therefore, as illustrated in FIG. 18, the control unit 80 may prohibit downward movement of the blocking plate 60 from the upper position to the lower position by the blocking plate lifting mechanism 61 after Step S63h (Step S65).

In the above-mentioned embodiment, the generation status of fumes is determined based on the average value of luminance values of the evaluation area A2 in the difference image Id. However, the generation status of fumes may be determined based on a sum value of luminance values of the evaluation area A2.

In the above-mentioned embodiment, the number of evaluation areas A2 which are set in the imaging area A1 is 1. However, the number of evaluation areas A2 which are set in the imaging area A1 may be equal to or greater than 2. The generation statuses of fumes in the two or more evaluation areas A2 may be determined.

Figure 19:
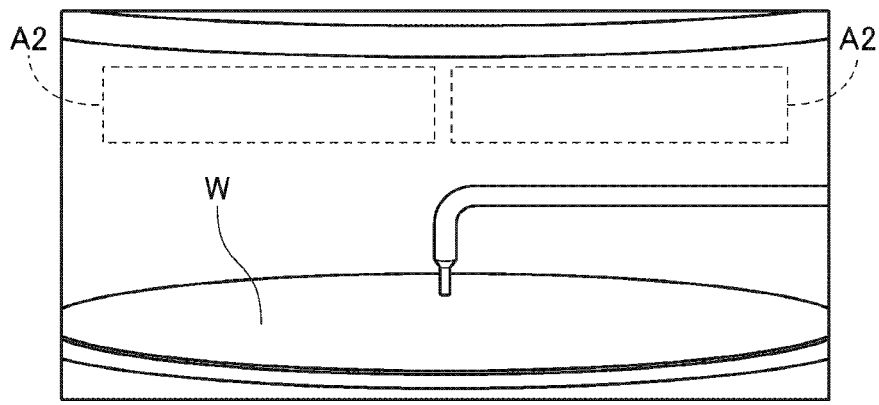
FIG. 19 is a diagram illustrating an example in which a plurality of evaluation areas are set horizontally.

For example, as illustrated in FIG. 19, a plurality of evaluation areas A2 may be set laterally in the imaging area A1. In this case, a user can ascertain additional information such as deviation of an air flow from the results of determination in the evaluation areas A2. Since the area of each evaluation area becomes smaller, it is possible to more accurately determine the generation statuses of fumes in the evaluation areas A2.

Figure 20:
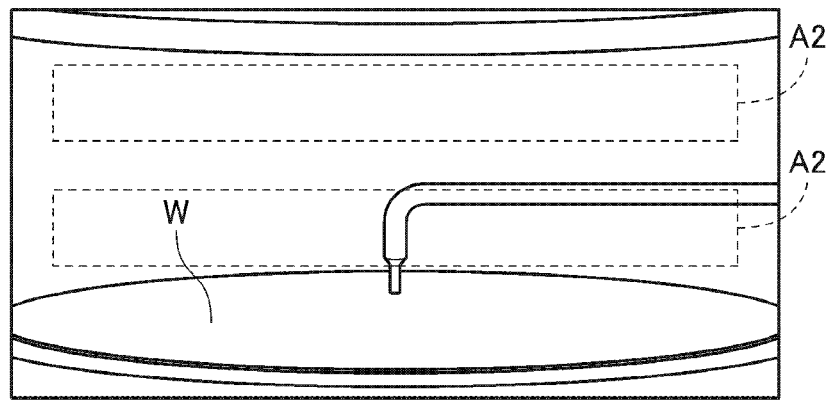
FIG. 20 is a diagram illustrating an example in which a plurality of evaluation areas are set vertically.

As illustrated in FIG. 20, a plurality of evaluation areas A2 may be set vertically in the imaging area A1. A space close to the top surface of the substrate W held by the substrate holding unit 20 may also be set as an evaluation area A2. In this case, in the evaluation area A2 close to the top surface of the substrate W, for example, when fumes are to be generated but fumes are not generated as in the hydrogen peroxide water extruding process of Step S33 (when the sum value or the average value of the luminance values in the evaluation area A2 does not reach a preset threshold value), it may be determined that the generation status of fumes is abnormal. This determination of abnormality may be performed in combination with the determination method which has been described with reference to FIG. 9. That is, when at least one of the determination result in one evaluation area A2 in a space closed to the top surface of the substrate W (abnormality is determined when the sum value or the average value of the luminance values is less than the threshold value) and the determination result in the other evaluation area A2 located above the evaluation area A2 (abnormality is determined when the sum value or the average value of the luminance values is equal to or greater than the threshold value) indicates abnormality, it may be determined that the generation status of fumes is abnormal as a whole.

When a plurality of evaluation areas A2 are set vertically, the position of the outer cup 53 may be changed depending on the position of the evaluation area A2 which is determined to be abnormal. For example, the third guide plate 530 of the outer cup 53 may be disposed beside the evaluation area A2 at the highest position from the evaluation areas A2 which are determined to be abnormal.

In the above-mentioned embodiment, the fume determination process (Steps S61 to S63) are performed in the process of supplying a processing liquid in Step S3. However, the fume determination process (Steps S61 to S63) may be performed only when a processing liquid which can easily generate fumes is supplied in the process of supplying a processing liquid in Step S3. For example, the fume determination process may be performed only when the SPM cleaning solution is supplied and the hydrogen peroxide water extruding process is performed. It is preferable that the fume determination process be performed at least when the hydrogen peroxide water extruding process is performed.

The fume determination process is performed in the processing liquid supply process, and an intensive monitoring process of increasing the number of frames which are captured by the camera 72 particularly when the SPM cleaning solution is supplied and the hydrogen peroxide water extruding process is performed (that is, the time interval at which an image is captured is decreased: for example, an image was repeatedly captured every 0.1 seconds, but an image is repeatedly captured every 0.05 seconds only when the SPM cleaning solution is supplied and the hydrogen peroxide water extruding process is performed). By performing the intensive monitoring process, a captured image can be acquired at smaller time intervals particularly in some processes in which fumes can be easily generated and the number of acquired captured images can be reduced in the other processes. As a result, it is possible to reduce an amount of data stored in the storage unit 83.

In the above-mentioned embodiment, a reference image Ir is acquired immediately before supply of a processing liquid to the substrate W is started. However, the time at which the reference image Ir is acquired may be a different time. The number of reference images Ir is not limited to 1. For example, a captured image Is acquired prior by a predetermined time to the captured image Is to be determined may be used as a reference image Ir.

In the above-mentioned embodiment, the control unit 80 has both a function of controlling operations of the constituent elements of the processing unit 102 and a function as a determination unit that determines the generation status of fumes. However, the control unit that controls operations of the constituent elements of the processing unit 102 and the determination unit that determines the generation status of fumes may be embodied by separate computers.

In the above-mentioned embodiment, the substrate W to be processed is a silicon wafer for semiconductor. However, the substrate to be processed in the disclosure is not limited to a silicon wafer, and may be another substrate for a precise electronic device such as a glass substrate for a flat panel display such as a liquid crystal display, a glass substrate for a photo mask, or a glass substrate for a solar cell.

Shapes of details of the substrate processing equipment may be different from the shapes illustrated in the drawings of the disclosure. The elements described in the above-mentioned embodiment or the above-mentioned modified examples may be appropriately combined without causing inconsistency.

<7. Embodiments of Other Aspects>

In view of "recovering fumes from a space above a substrate using a cup", an embodiment not including the fume determination process (imaging and determination based on a captured image) as essential requirements but including change of a gap size between the cup and the annular wall as essential requirement instead can be extracted from the above-mentioned embodiment (FIGS. 8 and 16 and the like).

When the embodiment is described as a device, there is provided "substrate processing equipment including: a chamber, a substrate holding unit configured to hold a substrate horizontally in the chamber; a processing liquid supply unit configured to supply a processing liquid to a top surface of the substrate held by the substrate holding unit; a cup configured to surround the substrate, an exhaust unit configured to discharge a gas to the outside of the chamber from a space inside the cup; a cup lifting mechanism configured to move the cup upward and downward; and an annular wall located outside the cup, wherein the cup lifting mechanism moves the cup upward from a first position to a second position which is higher than the first position at the time of recovery of the fumes and a gap between the cup and the annular wall at the second position is smaller than the gap between the cup and the annular wall at the first position."

When the embodiment is described as a method, there is provided, for example, "a fumes recovery method of recovering fumes from a space above a substrate in equipment that supplies a processing liquid to the top surface of the substrate while holding the substrate horizontally in a chamber, the fumes recovery method including: a) a step of disposing a cup surrounding the substrate at a first position and supplying a processing liquid to the top surface of the substrate; and b) a step of moving the cup from the first position to a second position which is higher than the first position, wherein a gas is discharged to the outside of the chamber from a space inside the cup in the steps of a) and b), and a gap between the cup and the annular wall at the second position is smaller than the gap between the cup and the annular wall at the first position."

According to these embodiments, the cup is moved upward from the first position to the second position at the time of recovery of fumes. Then, the gap between the cup and the annular wall is decreased. Accordingly, it is possible to reduce a flow rate of a gas flowing outside the cup and to efficiently introduce fumes along with the gas into the cup. As a result, it is possible to curb diffusion of fumes in the chamber. These embodiments may be combined with the elements described in the above-mentioned embodiment or modified examples.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A fume determination method of determining a generation status of fumes in equipment that supplies a processing liquid on a top surface of a substrate while holding the substrate horizontally in a chamber, the fume determination method comprising:

a step of a) capturing an image of a predetermined imaging area in the chamber; and a step of b) determining a generation status of fumes in the chamber based on luminance values of the captured image acquired in the step of a), wherein the step of b) comprises:

a step of b-1) generating an image indicating a difference in luminance value between a reference image of the imaging area which is acquired in advance and the captured image; and a step of b-2) determining the generation status of fumes in the chamber based on the difference image.

2. The fume determination method according to claim 1, wherein the imaging area comprises at least one evaluation area; and wherein the step of b-2) comprises determining the generation status of fumes in the evaluation area based on a sum value or an average value of luminance values of the evaluation area in the difference image.

3. The fume determination method according to claim 2, wherein the step of b-2) comprises determining the generation status of fumes in the evaluation area based on a result of comparison between the sum value or the average value of the luminance values of the evaluation area in the difference image and a preset first threshold value.

4. The fume determination method according to claim 3, wherein the step of a) comprises repeatedly capturing an image of the imaging area;

wherein the step of b-1) comprises generating a plurality of difference images based on a plurality of captured images acquired in the step of a); and wherein the step of b-2) comprises setting the sum value or the average value of the luminance values of the evaluation area as an integration target value, integrating an access value obtained by subtracting the first threshold value from the integration target value or the integration target value, and determining the generation status of fumes in the evaluation area based on a result of comparison between the acquired integrated value and a preset second threshold value when the sum value or the average value is equal to or greater than the first threshold value.

5. The fume determination method according to claim 2, wherein the evaluation area comprises a space above the substrate which is held horizontally.

6. The fume determination method according to claim 5, wherein the evaluation area comprises a space close to a bottom surface of a disc-shaped blocking plate that is disposed above the substrate.

7. The fume determination method according to claim 2, wherein the imaging area comprises a plurality of evaluation areas; and wherein the step of b) comprises determining the generation status of fumes in each of the plurality of evaluation areas.

8. The fume determination method according to claim 7, wherein the plurality of evaluation areas comprise a space close to the top surface of the substrate which is held horizontally.

9. The fume determination method according to claim 1, wherein the equipment supplies a cleaning solution comprising sulfuric acid and hydrogen peroxide water as the processing liquid to the top surface of the substrate.

10. The fume determination method according to claim 9, wherein the equipment performs a hydrogen peroxide water extruding process of stopping supply of sulfuric acid and supplying hydrogen peroxide water to the top surface of the substrate after supplying the cleaning solution to the top surface of the substrate; and wherein the step of a) and the step of b) are performed at least in the hydrogen peroxide water extruding process.

11. A substrate processing method in equipment that supplies a processing liquid to a top surface of a substrate while holding the substrate horizontally in a chamber, the equipment comprising a cup that surrounds the substrate and an exhaust unit that discharges a gas from a space inside the cup to the outside of the chamber, the substrate processing method comprising:

a step of a) capturing an image of a predetermined imaging area in the chamber;

a step of b) determining a generation status of fumes in the chamber based on luminance values of the captured image acquired in the step of a); and a step of c) changing a position of the cup in a vertical direction based on the determination result in the step of b).

12. The substrate processing method according to claim 11, wherein the step of c) comprises moving the cup upward from a first position to a second position which is higher than the first position when it is determined in the step of b) that the generation status of fumes is abnormal.

13. The substrate processing method according to claim 12, wherein the equipment further comprises an annular wall that is located outside the cup; and wherein a gap between the cup and the annular wall at the second position is smaller than the gap between the cup and the annular wall at the first position.

14. The substrate processing method according to claim 11, wherein the equipment comprises a plurality of cups that multiply surround the substrate; and wherein the step of c) comprises changing a position in a vertical direction of the outermost cup of the plurality of cups based on a result of determination in the step of b).

* * * * *